Figure 1:
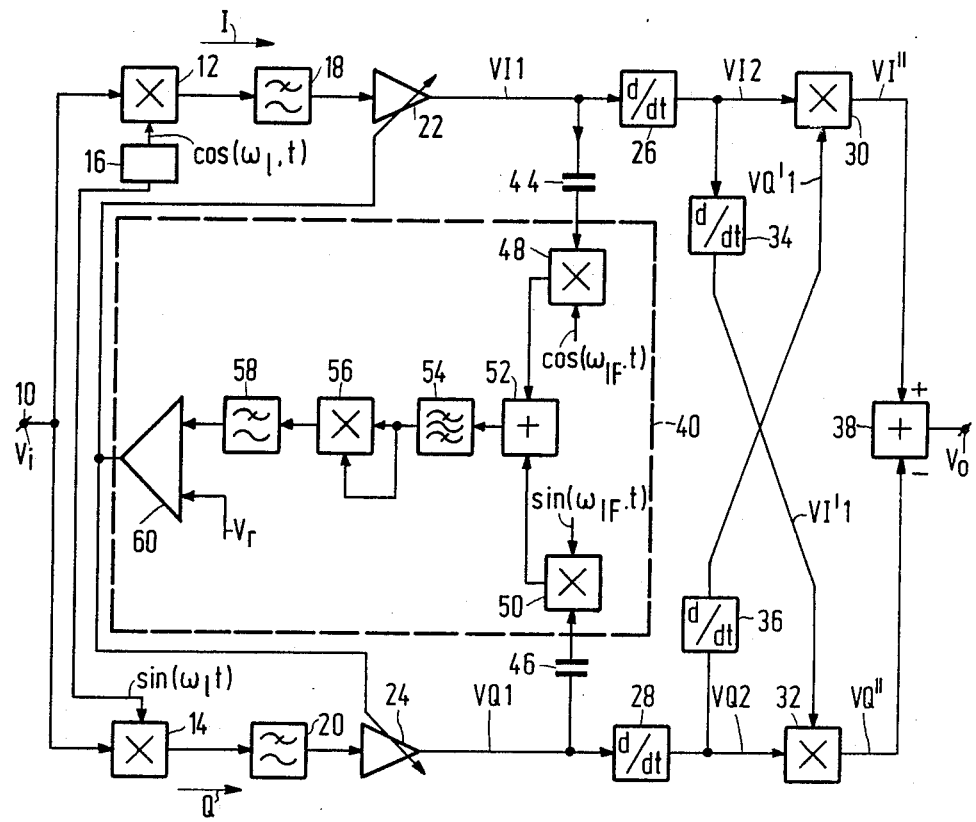

United States Patent [19]

Chung

[11] Patent Number: 4,955,078
[45] Date of Patent: Sep. 4, 1990

[54] FREQUENCY DIFFERENCE DETECTOR (FDD) HAVING AUTOMATIC GAIN CONTROL AND A CARRIER MODULATED RECEIVER INCLUDING THE FDD

[75] Inventor: Kah-Seng Chung, Bull Creek, Australia

[73] Assignee: U.S. Philips Corporation, New York, N.Y.

[21] Appl. No.: 249,635

[22] Filed: Sep. 23, 1988

[30] Foreign Application Priority Data

Oct. 5, 1987 [GB] United Kingdom ................. 8723313

[51] Int. Cl.$^5$ .............................................. H04L 27/14
[52] U.S. Cl. .................... 455/244; 455/234; 455/304; 455/314
[58] Field of Search ............... 455/205, 207, 209, 214, 455/336, 337, 302–306, 314, 315, 234, 244; 329/50; 375/100, 102

[56] References Cited

U.S. PATENT DOCUMENTS

| | | | |
|---|---|---|---|
| 3,160,815 | 12/1964 | Ford et al. ........................ | 455/209 |
| 4,200,871 | 4/1980 | Roeder et al. ..................... | 342/78 |
| 4,677,690 | 6/1987 | Reed .................................. | 455/207 |
| 4,736,390 | 4/1988 | Ward et al. ......................... | 455/315 |
| 4,736,392 | 4/1988 | Kammeyer et al. ................ | 375/80 |

*Primary Examiner*—Reinhard J. Eisenzopf
*Assistant Examiner*—Edward Urban
*Attorney, Agent, or Firm*—David R. Treacy

[57] ABSTRACT

A frequency difference detector (FDD) implemented as a balanced quadricorrelator has an automatic gain control system (68) having inputs capacitively coupled to the quadrature related, baseband frequency paths from the front end mixers (12,14). The a.g.c. system (68) has quadrature related mixers (78,80) coupled to said inputs for frequency up-converting the baseband signals to an intermediate frequency. The IF signals from the mixers are summed in a summing circuit (82) and subsequently squared in a squaring circuit (86). Any ripple in the output of the squaring circuit is removed by low pass filtering to produce a d.c. control signal which is applied to gain controlled amplifiers (22,24) present in said baseband frequency paths in order to render the output ($V_o$) of the FDD less sensitive to variations in the input signal ($V_i$).

19 Claims, 2 Drawing Sheets

FREQUENCY DIFFERENCE DETECTOR (FDD) HAVING AUTOMATIC GAIN CONTROL AND A CARRIER MODULATED RECEIVER INCLUDING THE FDD

The present invention relates to a frequency difference detector (FDD) having automatic gain control and to a carrier modulated receiver including the FDD.

Figure 3:
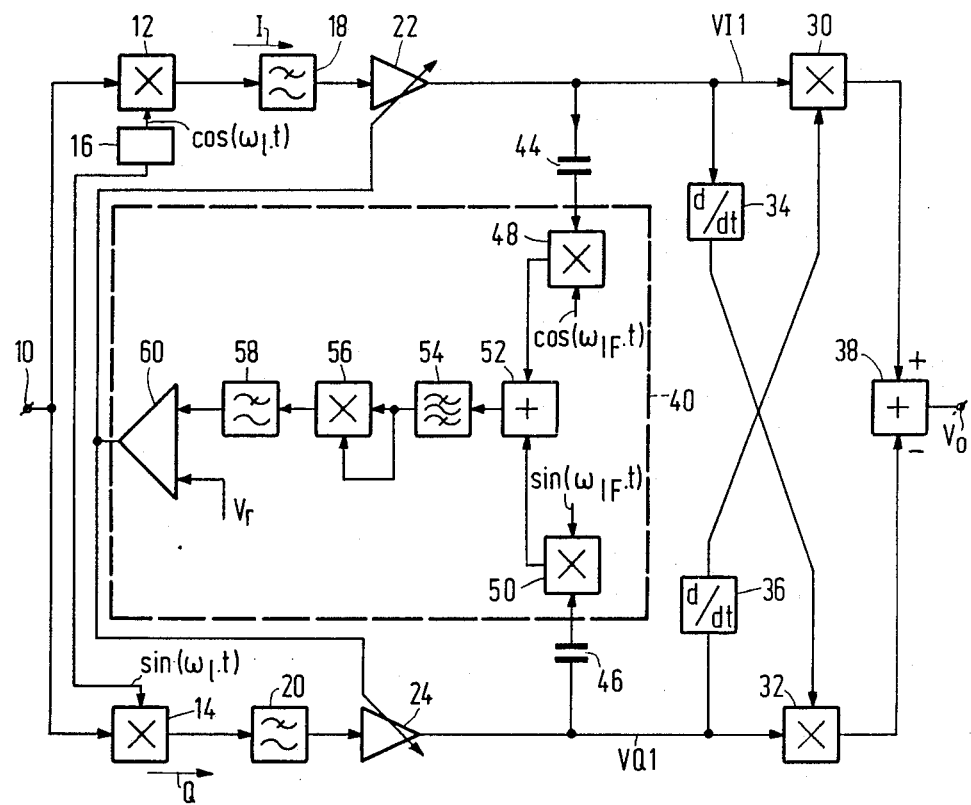

In carrier modulated receivers it is essential for the local oscillator frequency to track the transmitted carrier frequency so that the difference between the two frequencies is set to within a tolerable accuracy. Automatic frequency control (AFC) circuits are normally used for deriving a measure of this difference in frequency and for automatically adjusting the local oscillator. Consequently a frequency difference detector forms the heart of all AFC loops and can be realised in various forms. The particular FDD of interest in the present application is termed a balanced quadricorrelator. A known type of balanced quadricorrelator is shown in FIG. 3 of an article "Properties of Frequency Difference Detectors" by Floyd M. Gardner, IEEE Transactions on Communications, Vol COM 33 No. 2, Feb. 1985, Pages 131 to 138. The known circuit comprises quadrature related, first and second mixers in which an input signal is mixed down to I and Q baseband signals. Low pass filters are provided in the output circuits of the first and second mixers in order to select the in-band signal components. The output of one of the low pass filters is (1) applied to an input of a third mixer and (2) differentiated and applied to an input of a fourth mixer. The output of the other of the low pass filters is (1) applied to another input of the third mixer and (2) differentiated and applied to another input of the third mixer. The outputs of the third and fourth mixers are subtracted from each other to provide a frequency difference signal. It can be shown that the output voltage $V_d$ of such a balanced quadricorrelator is proportional to the frequency difference $\Delta\omega$ between the transmitted carrier and the local oscillator and is given by $$V_d \alpha E^2 \cdot \Delta\omega$$

where E is the amplitude of the input signal. It is evident from this equation that the detected output voltage is highly senstitive to the amplitude E of the input signal which is a shortcoming of this type of circuit.

A.g.c. systems for balanced quadricorrelator circuits are known, for example from Japanese Kokai No. 58-137309. In the known a.g.c. system the signals from the low pass filters in the two signals paths are applied to gain controlled amplifiers and the outputs therefrom are squared and summed to produce a signal freed of modulation. This signal is applied as a control signal to the gain controlled amplifiers. Such an arrangement is not optimum because the multipliers used in squaring the signals from the gain controlled amplifiers suffer from a dynamic range problem due to accumulated d.c. offsets in the mixers and gain controlled amplifiers.

It is an object of the present invention to provide an improved automatic gain control system for FDD's.

According to the present invention there is provided a frequency difference detector comprising means for producing quadrature related first and second baseband signals, means for selecting in-band signal components in said first and second baseband signals, variable gain amplifying means responsive to an a.g.c. signal for adjusting the amplitude of the in-band signal components, and an a.g.c. system for providing said a.g.c. signal, said a.g.c. system comprising first and second inputs capacitively coupled to signal paths carrying the in-band signal components of the quadrature related first and second signals, first and second quadrature related mixers for frequency up-converting the signals on the first and second inputs, respectively, means for summing said frequency up-converted signals, means for squaring the summed signal and means for deriving an a.g.c. signal from the squared signal and for applying the a.g.c. signal to the variable gain amplifying means.

The present invention also provides a frequency difference detector comprising a signal input terminal, a local oscillator, first and second mixers, means coupling the signal input terminal to first inputs of the first and second mixers and the local oscillator to second inputs of the first and second mixers, a 90° phase shifter provided in the signal/local oscillator path to one of the inputs of the first and second mixers whereby the first and second mixers produce first and second orthogonally related outputs, respectively, first and second frequency selecting means provided in the output circuits of the first and second mixers, respectively, a first electrical path connecting the first frequency selecting means to a first input of a third mixer, a second electrical path connecting the first frequency selecting means to a second input of a fourth mixer, a third electrical path connecting the second frequency selecting means to a first input of the fourth mixer, a fourth electrical path connecting the second frequency selecting means to a second input of the third mixer, differential means provided in the second and fourth electrical paths, signal substracting means connected to outputs of the third and fourth mixers, first and second adjustable gain amplifiers connected respectively in first and second signal branches between the input terminal and the third and fourth mixers and an automatic gain control circuit comprising fifth and sixth mixers having first inputs capacitively connected to the first and second branches, respectively, second inputs of the fifth and sixth mixers being connected to quadrature related outputs of an intermediate frequency local oscillator, summing means for summing the outputs of the fifth and sixth mixers, a signal squaring means coupled to the output of the summing means and a low pass filtering means for passing at least the d.c. component of the output signal from the squaring means, which d.c. component comprises a gain control signal for the first and second adjustable gain amplifiers.

In the FDD made in accordance with the present invention the problem of d.c. offsets in the signals applied to the a.g.c. system is mitigated by using capacitors. Additionally unlike the known a.g.c. system in which the baseband signals are squard, the a.g.c. signal is derived from a remodulated signal at an intermediate frequency. The specification of the fifth and sixth mixers used for the quadrature remodulation of the baseband signals is not critical because the summed output from these mixers is used only for deriving a measure of the input signal strength and not for demodulation.

If desired a bandpass filter may be connected between the summing means for summing the outputs of the fifth and sixth mixers and the signal squaring means. The envelope of the signal at the output of the bandpass filter is representative of the input signal amplitude. E.

Figure 2:
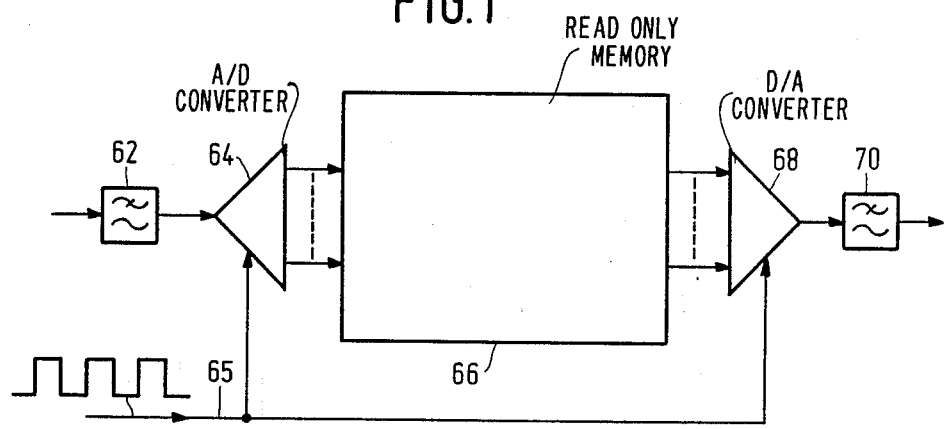

The present invention will now be described, by way of example, with reference to the accompanying drawings, wherein:

FIG. 1 is a block schematic circuit of a first embodiment of a FDD made in accordance with the present invention, FIG. 2 illustrates a digital demodulator, and FIG. 3 is a block schematic circuit to a second embodiment of a FDD made in accordance with the present invention.

In the drawings the same reference numerals have been used to indicate the corresponding features.

The FDD shown in FIG. 1 comprises a quadrature front end comprising first and second mixers 12, 14 having inputs connected to an input terminal 10 and to a local oscillator. Outputs from the mixers 12, 14 are quadrature related and in the illustrated embodiment this is carried out by phase shifting the local oscillator signal applied to the second mixer 14. Alternatively a 90° phase shifter could be connected between the input terminal 10 and signal input to the first or second mixer. The local oscillator frequency may be the same as or slightly different from the carrier frequency of an input signal $V_i$. Low pass filters 18, 20 select the difference components in the outputs of the first and second mixers 12, 14. The filtered signals have their amplitudes adjusted by adjustable gain amplifiers 22, 24 and produce signals VI1 and VQ1, where I means in-phase and Q means quadrature phase. The signals VI1 and VQ1 are differential once in differencial circuits 26, 28, respectively, and applied to first inputs of third and fourth mixers 30, 32 as signals VI2 and VQ2, respectively. These signals VI2 and VQ2 are differentiated in differential circuits 34, 36 and applied as signals VI′1 and VQ′1 to second inputs of the fourth and third mixers 32, 30, respectively. The outputs VI″ and VQ″ are applied to a subtracting circuit 38 which produces an output signal $V_O$.

By differentiating the signals applied to both inputs of the third and fourth mixers any d.c. offset voltages are blocked because "differentiation" is a high pass junction. Thus the dynamic range of these mixers 30, 32 will not be affected by the accumulated offsets in the preceding circuit stages. The only d.c. offset voltages which could appear in the output signal $V_O$ are those due to the mixers 30, 32 and the subtracting circuit 38. It is necessary to ensure that there is one order difference between the differentiated signals applied to the first inputs of the mixers 30, 32 and those applied to the second inputs of the same mixers.

The signals at the various points of FIG. 1 are given as follows:

$$V_i = E \cdot \cos(\omega_i \cdot t)$$

$$VI1 = \frac{E}{2} \cdot \cos(\Delta\omega \cdot t)$$

$$VI2 = -\frac{E}{2} \cdot \Delta\omega \cdot \sin(\Delta\omega \cdot t)$$

$$VI'1 = -\frac{E}{2} \left[ \sin(\Delta\omega \cdot t) \cdot \frac{d(\Delta\omega)}{dt} + \Delta\omega^2 \cdot \sin(\Delta\omega \cdot t) \right]$$

$$VQ1 = \frac{E}{2} \cdot \sin(\Delta\omega \cdot t)$$

$$VQ2 = \frac{E}{2} \cdot \Delta\omega \cdot \cos(\Delta\omega \cdot t)$$

-continued $$VQ'1 = \frac{E}{2} \left[ \cos(\Delta\omega \cdot t) \cdot \frac{d(\Delta\omega)}{dt} - \Delta\omega^2 \cdot \sin(\Delta\omega \cdot t) \right]$$

$$VI'' = -\frac{E^2}{4} \left[ \Delta\omega \cdot \sin(\Delta\omega \cdot t) \cdot \cos(\Delta\omega \cdot t) \cdot \frac{d(\Delta\omega)}{dt} - (\Delta\omega)^3 \cdot \sin^2(\Delta\omega \cdot t) \right]$$

$$VQ'' = -\frac{E^2}{4} \left[ \Delta\omega \cdot \sin(\Delta\omega \cdot t) \cdot \cos(\Delta\omega \cdot t) \cdot \frac{d(\Delta\omega)}{dt} + (\Delta\omega)^3 \cdot \cos^2(\Delta\omega \cdot t) \right]$$

$$V_O = VI'' - VQ'' = \frac{E^2}{4} \cdot (\Delta\omega)^3 \alpha E^2 (\Delta\omega)^3$$

where E is amplitude and $\Delta\omega$ is the frequency difference between the transmitted carrier $\omega_i$, and the local oscillator $\omega_1$, such that $\Delta\omega = (\omega_1 - \omega_i)$. The final equation for $V_O$ shows that the output of the FDD is now proportional to $(\Delta\omega)^3$, instead of $(\Delta\omega)$ as with an conventional balanced quadricorrelator. This change in output for a given change in frequency difference $(\Delta\omega)$ associated with the embodiment of FIG. 1 is much greater and is a desirable characteristic. Such a characteristic reduces the remaining problems of d.c. offsets due to the third and fourth mixers 30, 32 and the subtracting circuit 38.

Provided that there is a difference of one differential order between the inputs to each of the third and fourth mixers 30, 32 then various arrangements of differential circuits are possible in order to ensure that the inputs to the third and fourth mixers 30, 32 are free of d.c. offsets. A limiting factor in selecting an arrangement is that differentiation is a noise enhancement process and in practice a compromise has to be made having regard to circuit complexity and noise consideration.

It will be recalled that the output signal $V_O$ from the subtracting circuit 38 (FIG. 1) certains a term in $E^2$ where E is the input voltage to the FDD. In order to make $V_O$ less sensitive to variations in the input signal $V_i$ an automatic gain control (a.g.c.) system 40 is provided in the FDD shown in FIG. 1. The adjustable gain amplifiers 22, 24 are provided in the I and Q signal paths at appropriate signal points. The positions shown at the outputs of the low pass filters 18, 20 are only exemplary in order to illustrate the operating principle.

The inputs to the a.g.c. circuit 40 comprise the signals VI1 and VQ1 which are coupled via capacitors 44, 46 to mixers 48, 50 in which they are frequency up-converted to an intermediate frequency (IF) of say 100 KHz which is applied in quadrature to these mixers 48, 50. The outputs of the mixers 48, 50 are combined in a summing circuit 52. The combined signal is band pass filtered in a filter 54 and the output signal therefrom is squared, that is multiplied by itself, in a multiplier 56. A low pass filter 58 is connected to the multiplier 56 to remove ripple due to modulation and provide a d.c. signal. The output from the low pass filter 58 is applied to an op-amp 60 to which a reference voltage $V_r$ is applied. The output voltage from the op-amp 60 comprises the d.c. gain control signal for the amplifiers 22, 24.

The squaring of the signal from the band pass filter 54 may alternatively have been carried out using a rectifier or a logarithmic amplifier.

The FDD can be used as a demodulator for a FM singal. However since the output signal $V_O$ of the FDD is not linearly related to the frequency difference of the input signal $V_i$, $V_O$ being proportional to $(\Delta\omega)^3$, an extra signal processing step in needed to recover the original modulation.

The equation for the output $V_O$ of the FDD can be rewritten as follows:

$$V_O = K(\Delta\omega)^3 = K(\omega_c + \omega_m)^3$$

where $\omega_c$ is a constant frequency difference, and $\omega_m$ is the instantaneous frequency produced by the modulating signal, and K is a gain constant.

The desired modulation can now be recovered by processing $V_O$ of the preceding equation with a cube root function. This can be done digitally or by analogue signal processing. However a cube root function is not an easy function to realise and a digital embodiment will be described with reference to FIG. 2.

The FDD output signal $V_O$ is low pass filtered in a filter 62 and applied to an analogue-to-digital converter 64 which is clocked by clock signals on a line 65. The digitised output is applied to a read only memory (ROM) 66 which serves as a look-up table for the required cube root function, namely $$[V_O]^{\frac{1}{3}} = \mathrm{Exp}\left[\frac{\mathrm{sign}(V_O)}{3} \cdot \ln(|V_O|)\right]$$

The output of the ROM 66 is applied to a digital-to-analogue converter 68 which provides an analogue cube root signal which is low pass filtered in a filter 70 to provide an output formed by the modulating signal.

The use of the described FDD as an FM demodulator provides two advantages over conventional dual branch architecture thereby reducing the output distortion. These two advantages are:

(1) The problem of "hole-in-spectrum" caused by a.c. coupling is avoided.

(2) The cross-coupling of the two branches suggests that deviations in gain and phase of the two branches could be balanced-out thus reducing distortion and interference in the audio output caused by these imperfections.

Referring to FIG. 3 which illustrates another embodiment of an FDD having automatic gain control, the basic FDD circuit without the a.g.c. system 40 is known per se and is disclosed for example in FIG. 3 of an article "Properties of Frequency Difference Detectors" by Floyd M. Gardner, IEEE Transactions on Communications, Vol. COM 33, No. 2, Feb. 1985, pages 131 to 138. The difference between the embodiment shown in FIG. 1 and that shown in FIG. 3 is that the signal inputs to the first inputs of the third and fourth mixers 30,32 have not been differentiated or high pass filtered so that these signals contain d.c. offsets which have been accumulated in the preceding processing steps in the FDD.

Nevertheless the output signal $V_o$ does contain a term in $E^2$ and in consequence the output signal is sensitive to amplitude changes in the input signal. Providing the a.g.c. system 40 reduces this sensitivity of the output signal to changes in the input signal $V_i$. As the a.g.c. system has been described in full with reference of FIG. 1, it will not be repeated.

From reading the present disclosure, other modifications will be apparent to persons skilled in the art. Such modifications may involve other features which are already known in the design, manufacture and use of FDDs and carrier modulated receivers and component parts therof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not mitigates any or all of the same technical problems as does the present invention. The applicants hereby give notice that new claims may be formulated to such features and/or combinations of such features during the prosecution of the present application or any further application derived therefrom.

What is claimed is:

1. A frequency difference detector comprising means for producing quadrature related first and second baseband signals, means for selecting in-band signal components in said first and second baseband signals, variable gain amplifying means responsive to an a.g.c. signal for adjusting the amplitude of the in-band signal components, and an a.g.c. system for providing said a.g.c. signal, said a.g.c. system comprising first and second inputs capacitively coupled to signal paths carrying the in-band signal components of the quadrature related first and second signals, first and second quadrature related mixers for frequency up-converting the signals on the first and second inputs, respectively, means for summing said frequency up-converted signals, means for squaring the summed signal and means for deriving an a.g.c. signal from the squared signal and for applying the a.g.c. signal to the variable gain amplifying means.

2. A frequency difference detector comprising a signal input terminal, a local oscillator, first and second mixers, means coupling the signal input terminal to first inputs of the first and second mixers and the local oscillator to second inputs of the first and second mixers, a 90° phase shifter provided in the signal/local oscillator path to one of the inputs of the first and second mixers whereby the first and second mixers produce first and second orthogonally related outputs, respectively, first and second frequency selecting means provided in the output circuits of the first and second mixers, respectively, a first electrical path connecting the first frequency selecting means to a first input of a third mixer, a second electrical path connecting the first frequency selecting means to a second input of a fourth mixer, a third electrical path connecting the second frequency selecting means to a first input of the fourth mixer, a fourth electrical path connecting the second frequency selecting means to a second input of the third mixer, differential means provided in the second and fourth electrical paths, signal subtracting means connected to outputs of the third and fourth mixers, first and second adjustable gain amplifiers connected respectively in first and second signal branches between the input terminal and the third and fourth mixers and an automatic gain control circuit comprising fifth and sixth mixers having first inputs capacitively connected to the first and second branches, respectively, second inputs of the fifth and sixth mixers being connected to quadrature related outputs of an intermediate frequency local oscillator, summing means for summing the outputs of the fifth and sixth mixers, a signal squaring means coupled to the output to the summing means and a low pass filtering means for passing at least the d.c. component of the output signal from the squaring means, which d.c. component comprises a gain control signal for the first and second adjustable gain amplifiers.

3. A detector as claimed in claim 2, wherein a bandpass filter is connected between the summing means and the signal squaring means.

4. A detector as claimed in claim 3, wherein differential means are provided in the first and third electrical paths and wherein the differential means in the first and thrid electrical paths are one order different compared to the differential means in the second and fourth electrical paths.

5. A detector as claimed in claim 4, wherein at least one differential means in the first and second electrical paths is common to both said paths and at least one differential means in the third and fourth electrical paths in common to both said paths.

6. A carrier modulated receiver having an FM demodulator including the frequency difference detector (FDD) as claimed in claim 5.

7. A receiver as claimed in claim 6, wherein the output signal of the FDD comprises a cubic function and wherein the modulating signal is recovered by obtaining the cube root of the said function.

8. A receiver as claimed in claim 7, wherein the output of the FDD is applied to a digital cube root circuit comprising an analogue to digital converter having outputs connected to a look-up table containing cube roots of the said function, and a digital to analogue converter coupled to the look-up table and having an output for the modulating signal.

9. A detector as claimed in claim 2, wherein differential means are provided in the first and third electrical paths and wherein the differential means in the first and third electrical paths are one order different compared to the differential means in the second and fourth electrical paths.

10. A detector as claimed in claim 9, wherein at least one differential means in the first and second electrical paths is common to both said paths and at least one differential means in the third and fourth electrical paths is common to both said paths.

11. A carrier modulated receiver having an FM demodulator including the frequency difference detector (FDD) as claimed in claim 9.

12. A receiver as claimed in claim 11, wherein the output signal of the FDD comprises a cubic function and wherein the modulating signal is recovered by obtaining the cube root of the said function.

13. A receiver as claimed in claim 12, wherein the output of the FDD is applied to a digital cube root circuit comprising an analogue to digital converter having outputs connected to a look-up table containing cube roots of the said function, and a digital to analogue converter coupled to the look-up table and having an output for the modulating signal.

14. A carrier modulated receiver having an FM demodulator including the frquency difference detector (FDD) as claimed in claim 2.

15. A receiver as claimed in claim 14, wherein the output signal of the FDD comprises a cubic function and wherein the modulating signal is recovered by obtaining the cube root of the said function.

16. A receiver as claimed in claim 15, wherein the output of the FDD is applied to a digital cube root circuit comprising an analogue to digital converter having outputs connected to a look-up table containing cube roots of the said function, and a digital to analogue converter coupled to the look-up table and having an output for the modulating signal.

17. A carrier modulated receiver having an FM demodulator including the frequency difference detector (FDD) as claimed in claim 1.

18. A receiver as claimed in claim 17, wherein the output signal of the FDD comprises a cubic function and wherein the modulating signal is recovered by obtaining the cube root of the said function.

19. A receiver as claimed in claim 18, wherein the output of the FDD is applied to a digital cube root circuit comprising an analogue to digital converter having outputs connected to a look-up table containing cube roots of the said function, and a digital to analogue converter coupled tot he look-up table and having an output for the modulating signal.

* * * * *